United States Patent
Su et al.

(10) Patent No.: US 10,770,293 B2
(45) Date of Patent: Sep. 8, 2020

(54) METHOD FOR MANUFACTURING A SEMICONDUCTOR DEVICE

(71) Applicant: TAIWAN SEMICONDUCTOR MANUFACTURING CO., LTD., Hsinchu (TW)

(72) Inventors: Yu-Chung Su, Hsinchu (TW); Yahru Cheng, Taipei (TW); Ching-Yu Chang, Yilang County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/105,934

(22) Filed: Aug. 20, 2018

(65) Prior Publication Data

US 2019/0067002 A1 Feb. 28, 2019

Related U.S. Application Data

(60) Provisional application No. 62/551,665, filed on Aug. 29, 2017.

(51) Int. Cl.
| | | |
|---|---|---|
| *H01L 21/027* | (2006.01) | |
| *G03F 7/16* | (2006.01) | |
| *H01L 21/033* | (2006.01) | |
| *H01L 21/768* | (2006.01) | |
| *H01L 21/311* | (2006.01) | |

(52) U.S. Cl.
CPC .......... *H01L 21/0276* (2013.01); *G03F 7/16* (2013.01); *H01L 21/0274* (2013.01); *H01L 21/0332* (2013.01); *H01L 21/0337* (2013.01); *H01L 21/31144* (2013.01); *H01L 21/768* (2013.01)

(58) Field of Classification Search
None
See application file for complete search history.

(56) References Cited

U.S. PATENT DOCUMENTS

| | | | |
|---|---|---|---|
| 2007/0120477 A1* | 5/2007 | Nakua | H05B 33/22 313/506 |
| 2011/0304053 A1 | 12/2011 | Lin et al. | |
| 2012/0244711 A1* | 9/2012 | Yin | H01L 21/3086 438/703 |
| 2015/0349132 A1 | 12/2015 | Yamazaki | |
| 2016/0071736 A1* | 3/2016 | Kim | H01L 21/31144 438/703 |
| 2016/0181100 A1* | 6/2016 | deVilliers | H01L 21/0337 438/702 |
| 2017/0148643 A1* | 5/2017 | Ham | H01L 21/0337 |
| 2018/0047575 A1* | 2/2018 | Cheng | H01L 21/3085 |

FOREIGN PATENT DOCUMENTS

| | | |
|---|---|---|
| JP | H07-226356 A | 8/1995 |
| TW | 201131695 A | 9/2011 |
| TW | 201441648 A | 11/2014 |

* cited by examiner

*Primary Examiner* — Khaja Ahmad
(74) *Attorney, Agent, or Firm* — McDermott Will & Emery LLP

(57) ABSTRACT

In a method of manufacturing a semiconductor device, a photo resist layer is formed over a substrate with underlying structures. The first photo resist layer is exposed to exposure radiation. The exposed first photo resist layer is developed with a developing solution. A planarization layer is formed over the developed photo resist layer. The underlying structures include concave portions, and a part of the concave portions is not filled by the developed first photo resist.

20 Claims, 7 Drawing Sheets

METHOD FOR MANUFACTURING A SEMICONDUCTOR DEVICE

This application claims priority of U.S. Provisional Patent Application No. 62/551,665 filed Aug. 29, 2017, the entire contents of which are incorporated herein by reference.

TECHNICAL FIELD

The disclosure relates to methods for manufacturing semiconductor integrated circuits, and more particularly to methods for planarizing uneven patterns.

BACKGROUND

As the semiconductor industry has progressed into nanometer technology process nodes in pursuit of higher device density, higher performance, and lower costs, challenges from both fabrication and design issues become greater. Lithography operations are one of the key operations in the semiconductor manufacturing process. In the lithography operations, flatness or unevenness of the underlying structure is important because of a tight focus margin in the lithography operations. Accordingly, it is necessary to planarize uneven underlying structures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
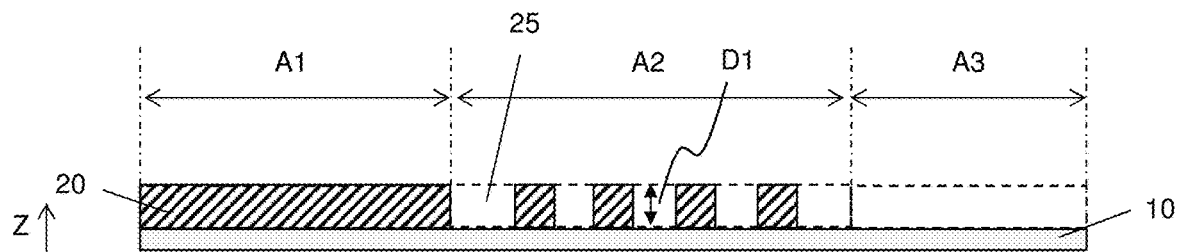
FIGS. 1A, 1B, 1C, 1D and 1E show cross sectional views of the various stages of a sequential semiconductor device manufacturing process according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The semiconductor devices include interconnect structures that include a plurality of interconnect pattern (line) layers having conductive patterns and a plurality of contact holes/vias for connecting various features in one portion/feature of a semiconductor chip (die) to other portions/features of the chip. The interconnect and via structures are formed of conductive materials such as metal, and the semiconductor devices include several interconnect layers in various embodiments.

The interconnect layer patterns in different layers are also coupled to one another through vias that extend vertically between one or several interconnect layers. The interconnect layer patterns are coupled to external features and can represent bit lines, signal lines, word lines, and various input/output connections in some embodiments. In some embodiments of the disclosure, each of the interconnect structures is formed by a damascene process, in which a layer of inter-metal dielectric (IMD) material is deposited, trenches and vias are formed and filled with conductive material (e.g., copper or aluminum or various alloys) and the surface is planarized by chemical mechanical polishing (CMP), although other patterning techniques are used in other embodiments. Because of the resolution limit of photolithography processes, multiple patterning lithography processes are used to form densely arranged interconnects and/or vias.

In the lithography operations, flatness of the underlying layer/structure is critical because of a tight focus margin. Accordingly, when the underlying layer/structure is uneven, it is necessary to planarize the unevenness with one or more planarization layers before applying a photo resist.

FIGS. 1A-1E show cross sectional views of the various stages of a sequential semiconductor device manufacturing process according to embodiments of the present disclosure. FIGS. 2A and 2B show plan views of the various stages of a sequential semiconductor device manufacturing process according to embodiments of the present disclosure. It is understood that additional operations can be provided before, during, and after processes shown by FIGS. 1A-1E, and some of the operations described below can be replaced or eliminated, for additional embodiments of the method. The order of the operations/processes may be interchangeable.

Figure 2A:
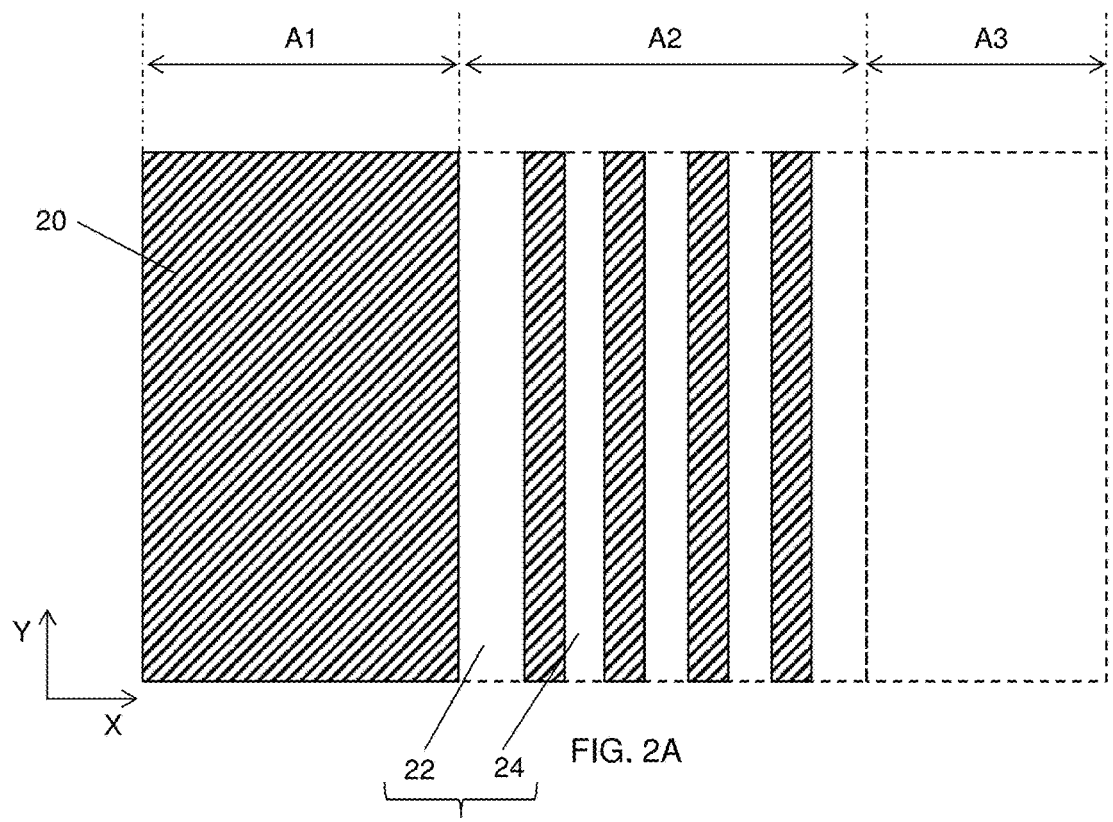
FIGS. 2A and 2B show plan views of the various stages of a sequential semiconductor device manufacturing process according to embodiments of the present disclosure.
Figure 2B:
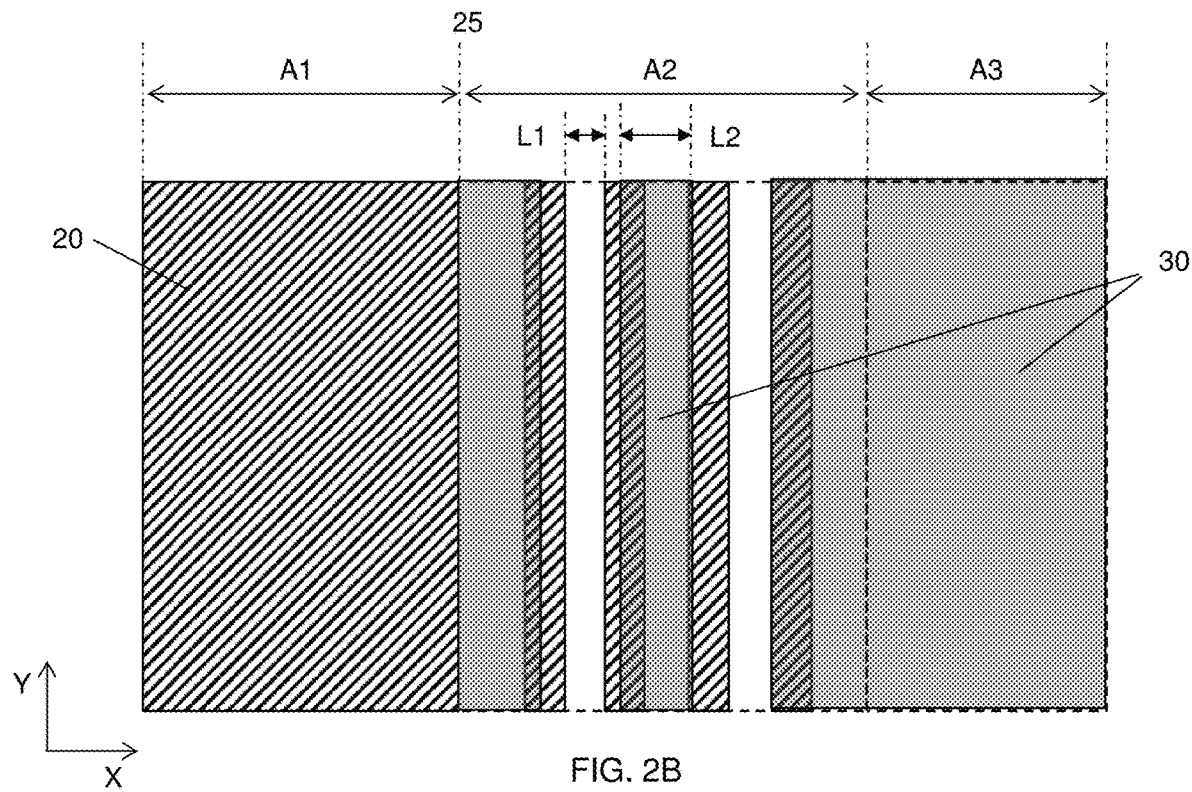

As shown in FIG. 1A, underlying structures 20 are disposed over an underlying layer 10. In some embodiments, the underlying layer 10 is a substrate and in other embodiments, the underlying layer 10 is an insulating material layer. In one embodiment, the substrate is a silicon substrate. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. Amorphous substrates, such as amorphous Si or amorphous SiC, or an insulating material, such as silicon oxide may also be used as the substrate. The substrate may include various regions that have been suitably doped with impurities (e.g., p-type or n-type conductivity).

The underlying structures 20 include various devices, structures, layers and/or elements. Examples of the underlying devices may include static random access memories (SRAMs) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, such as a FinFET, bipolar transistors, high voltage transistors, high frequency transistors, other memory cells, and combinations thereof. The semiconductor device may include a plurality of semiconductor devices (e.g., transistors), which may be interconnected. It is understood, however, that the application should not be limited to a particular type of device. These underlying devices are covered by one or more of interlayer dielectric (ILD) layers. The interlayer dielectric layer includes silicon oxide, silicon nitride, silicon oxynitride (SiON), SiOCN, fluorine-doped silicate glass (FSG), or a low-k dielectric material, or any other suitable dielectric material. The interlayer dielectric layer may be formed by chemical vapor deposition (CVD) or other suitable film forming processes. The formed interlayer dielectric layer may be subjected to a planarization process, such as an etch back process and/or a chemical mechanical polishing process.

Even after the interlayer dielectric is formed, the underlying structures 20 often have unevenness (topography) including convex portions (protrusions, mesas and/or hills) and/or concave portions (recesses, grooves, trenches, openings, holes and/or spaces), as shown in FIG. 1A. Further, there are different areas having different ratios of concave portions.

For example, as shown in FIGS. 1A and 2A, the substrate includes a first area A1, a second area A2 and a third area A3. FIG. 2A is a plan view (top view or layout view) of FIG. 1A. In the first area A1 (a high-flat area), the ratio (pattern density PD) of the concave portions with respect to the entire area A1 is 0% (PD=0), i.e., no concave portions. In the third area A3 (a low-flat area), the ratio of the concave portions with respect to the entire area A3 is 100% (PD=1), i.e., all concave portions (no convex portions). In the second area A2, the ratio of the concave portions with respect to the entire area A2 is more than 0% and less than 100% (0<PD<1). It is noted that "concave" is defined with respect to upper surface of the underlying structures, and "convex" is defined with respect to the upper surface of the underlying layer 10 (the bottom of the underlying structures 20).

In FIGS. 1A and 2A, three areas A1-A3 are illustrated, but the embodiments are not limited to this configuration. There are more than one area in which 0<PD<1 in some embodiments. Further, there are one or more additional areas between the areas A1 an A2 and/or A2 and A3 in some embodiments. The areas can be defined to have a micrometer-order area, such as, 10 μm×10 μm, 100 μm×100 μm in plan view.

As show in FIG. 1A, the concave portions of the underlying structure have the depth D1 (the height of the convex portions). Although the depths of the concave portions may not be the same among the concave portions, it is assumed that the concave portions have the same depth D1. In some embodiments, D1 can be defined as an average depth of the concave portions in the target area.

Figure 1B:
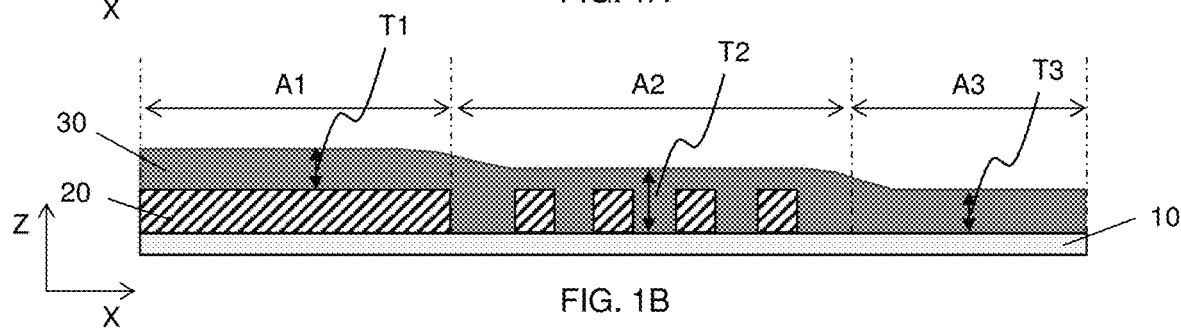

As shown in FIG. 1B, a photo resist layer 30 as a first planarization layer is formed over the underlying structures. Because of the different pattern density PD, the thickness of the first photo resist layer 30 varies. For example, in the area A1, the thickness of the first photo resist layer 30 is T1 on the convex portion; in the area A2, the thickness of the first photo resist layer 30 is T2 from the surface of the substrate 10; and in the area A3, the thickness of the first photo resist layer 30 is T3 from the surface of the substrate 10. In some embodiments, T2>T1, T3. In other embodiments, T1<T3<T2. The first photo resist layer 30 can be a positive photo resist or a negative photo resist. The first photo resist layer 30 can be a chemically amplified resist, which includes a polymer, an acid labile molecule, a photo acid generator (PAG), a quencher, a chromophore, a cross linker and/or a solvent. The first photo resist layer 30 can be spin-coated over the substrate 10, and subjected to a pre-baking operation.

After the first photo resist layer 30 is formed, the first photo resist layer 30 is exposed to an energy beam, through a photo mask (reticle). The energy beam includes g-line ultra violet light (436 nm), i-line ultra violet light (365 nm), KrF excimer laser light (245 nm), ArF excimer laser light (193 nm), extreme ultra violet (EUV) light (13.5 nm) or an electron beam.

Figure 1C:
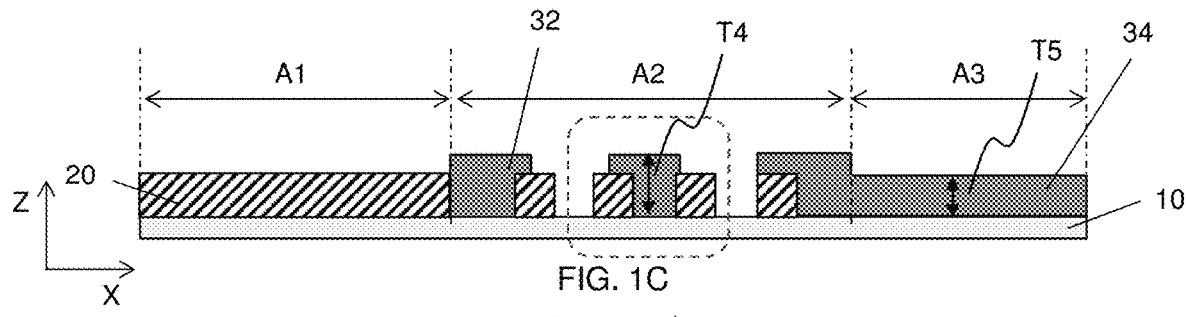

Then, as shown in FIG. 1C, the exposed photo resist layer 30 is developed with an appropriate developing solution. In some embodiments, an alkaline solution, such as tetramethylammonium hydroxide (TMAH), is used for a positive type photo resist. After the exposed first photo resist layer 30 is developed, a post-baking operation is performed. In some embodiments, a UV (ultra-violet) cure operation is also performed on the developed first photo resist layers 32, 34.

When a positive type photo resist is used, a region of the first photo resist layer 30, which has been exposed to the exposure radiation (light and/or energy beam), is dissolved into the developing solution. As shown in FIGS. 1C and 2B, no resist pattern remains in the area A1, where the pattern density PD=0. In other words, a photo mask having a transparent region corresponding to the area A1 is used in the exposure. In contrast, in the area A3, all photo resist layer 30 remains. In such a case, the photo mask also has an opaque (not-transparent) region corresponding to the area A3. In the area A2, patterns of the first photo resist layer 30 are formed. In such a case, the photo mask also has patterns of opaque patterns and transparent patterns in the region corresponding to the area A2.

When a negative type photo resist is used, a region of the first photo resist layer 30, which has not been exposed to the exposure radiation (energy beam), is dissolved into the developing solution. In such a case, a photo mask having a transparent region corresponding to the area A3 and an opaque region corresponding to the area A1 is used in the exposure. Further, if a negative type photo resist is used, a cross linking of the polymer in the negative type photo resist occurs during the post baking operation.

As shown in FIG. 1C, a part of the concave portions is not filled by the developed first photo resist layer 32. In some embodiments, a ratio of the concave portions filled by the developed first photo resist layer 32, 34 depends on the pattern density PD. For example, the ratio of the concave portions filled by the developed first photo resist layer increases as the pattern density PD increases.

In some embodiments, a volume of concave portions is calculated for each area. Before the first photo resist layer 30 is coated (see, FIG. 1A), the area A1 has a volume of concave portions $V_1I=0$ (i.e., no concave portions), the area A2 has a volume of concave portions $V_2I=V \times PD_2 \times D1$, where V is a constant depending on the area size, $PD_2$ is a pattern density of the area A2, and the area A3 has a volume of concave portions $V_3I=V \times PD_3 \times D1$, where $PD_3$ is a pattern density of the area A3. Here, it is assumed that the areas A1-A3 have the same area size. Since $PD_2$ is smaller than $PD_3$, $V_2I$ is smaller than $V_3I$.

After the first photo resist layer 30 is developed, the volume $V_2E$ of the developed first photo resist layer 32 in the area A2 can be calculated as follows: $V_2E=V \times (PD21 \times D1+PD22 \times (T4-D1))$, where PD21 is a ratio of concave portions filled by the developed first photo resist layer and PD22 is a ratio of the developed pattern in plan view, with respect to the entire area A2, and T4 is a thickness of the developed first photo resist in the concave portions.

In some embodiments of the present disclosure, the photo mask for the area A2 is designed such that $0.9<V_2I/V_2E<1.1$, and in other embodiments, $0.95<V_2I/V_2E<1.05$. In other words, $V_2E$ is substantially equal to $V_2I$. This means that the volume of the developed first photo resist layer in the area A2 is set to be substantially equal to the volume of the concave portions in the area A2.

Similarly, in the area A3, the volume $V_3E$ of the developed first photo resist layer 34 in the area A3 is set to be substantially equal to the volume $V_3I$ of the concave portions in the area A3. If the thickness T3 of the first photo resist layer before exposure is the same as the thickness T5 after the development, $V_3I=V_3E$, or $V_3I/V_3E=1$.

Further, in the area A1, the volume $V_1E$ of the developed first photo resist layer in the area A1 is set to be equal to the volume $V_2I$ of the concave portions in the area A1, and $V_1I=V_1E=0$.

Figure 1D:
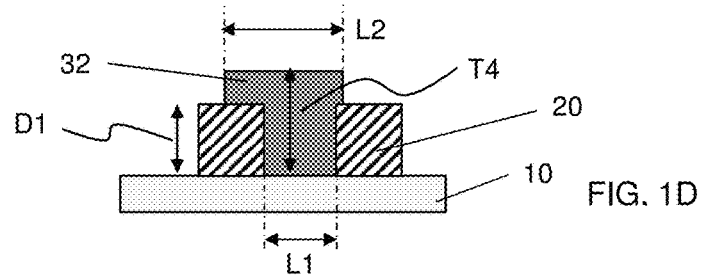

In the present disclosure, the photo mask is designed to obtain a developed photo resist layer satisfying $V_1I-V_1E \approx V_2I-V_2E \approx V_3I-V_3E$ ($\approx 0$), where a part of the concave portions is not filled by the developed first photo resist in the area A2. Thus, in area A2, some portions of the developed resist layer 32 are disposed over the concave portions as shown in FIGS. 1C and 1D. In some embodiments, the width of the concave portion is L1 and the width of the developed resist pattern 32 is L2, where L2>L1.

If the concave portions are fully filled by the developed first photo resist layer and the upper surface of the developed first photo resist layer is flush with the upper surface of the underlying structures (convex portions), the volume (e.g., $V_2E$) of the developed first photo resist layer would be equal to the volume (e.g., $V_2I$) of the concave portions. However, in the present disclosure, a part of the concave portions is not filled with the developed first photo resist layer. Thus, the portion of the developed first photo resist layer that is missing from the non-filled concave portions is disposed over the convex portions of the underlying structure and/or above the upper surface of the underlying structure.

Figure 1E:
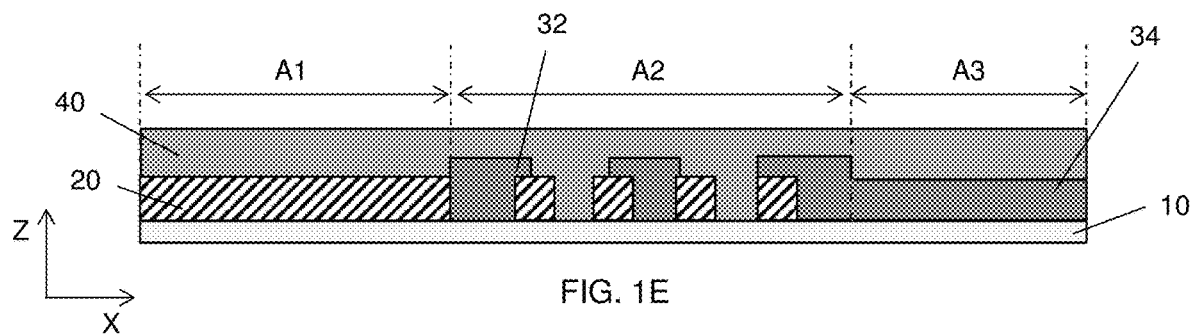

After the first photo resist layer 30 is developed and the developed first photo resist layers 32 and 34 are formed as shown in FIGS. 1C, 1D and 2B, a second planarization layer 40 is formed over the underlying structures 20 and the developed first photo resist layers 32 and 34, as shown in FIG. 1E.

The second planarization layer 40 is made of an organic material in some embodiments. In certain embodiments, the second planarization layer is made of photo resist. The first photo resist material for the second planarization layer 40 can be the same as or different from the first photo resist layer 30 as the first planarization layer.

When the second planarization layer is a photo resist layer, the first photo resist layer is sensitive to an energy beam, such as g-line ultra violet light (436 nm), i-line ultra violet light (365 nm), KrF excimer laser light (245 nm), ArF excimer laser light (193 nm), extreme ultra violet (EUV) light (13.5 nm) or an electron beam. If the first photo resist layers of the first planarization layer (photo resist layer 30) and the second planarization layer 40 are chemically amplified resists, at least one selected from the group consisting of a polymer structure, an acid labile molecule, a photo acid generator (PAG) amount, a quencher amount, a chromophore, a cross linker, and a solvent is different between the first planarization layer (photo resist layer 30) and the second planarization layer 40.

The second planarization layer 40 is not necessarily patterned by a photo lithography process. Thus, even when the second planarization layer 40 is made of a photo resist, no pattern is formed by a lithography operation (exposure and development) in the second planarization layer 40.

In some embodiments, the second planarization layer 40 has a different optical property than the first photo resist layer 30. In certain embodiments, the second planarization layer 40 is made of a bottom anti-reflective coating (BARC) material. In some embodiments, the second planarization layer 40 includes a spin-on-carbon (SOC) material.

The thickness of the second planarization layer 40 measured from the underlying layer (substrate) 10 is greater than the first photo resist layer 30 in some embodiments. Since a part of the concave portion is not filled by the first photo resist layer 30, the second planarization layer is in contact with the underlying layer 10. In some embodiments, the thickness of the second planarization layer 40 over the convex portion (high-flat area in the area A1) is smaller than the thickness of the first photo resist layer 30.

As set forth above, the photo mask is designed to obtain a developed photo resist layer satisfying $V_1-V_1E \approx V_2I-V_2E \approx V_3I-V_3E$ ($\approx 0$), where a part of the concave portions is not filled by the developed first photo resist in the area A2. By doing so, it is possible to form the second planarization layer to have a higher flatness. In some embodiments, $V_1I-V_1E=V_2I-V_2E=V_3I-V_3E=0$.

FIGS. 2A and 2B show plan views illustrating the patterns of the underlying structure 10 and the developed first photo resist layer 20 according to embodiments of the present disclosure.

As shown in FIG. 2A, the underlying patterns 20 have concave portions 25 including a first concave portion 22 and a second concave portion 24, both extending in the Y direction. After the developed first photo resist layer 30 is formed, the first concave portion 22 is fully filled with the first photo resist layer and the second concave portion 24 is not filled with the first photo resist layer. A part of the first photo resist layer 30 is formed over the convex portion disposed between the first concave portion 22 and the second concave portion 24. In some embodiments, at least one of the first concave portion 22 and the second concave portion 24 is partially filled by the first photo resist. In other words, a pattern edge along the Y direction of the developed first photo resist layer 30 is located in the middle of at least one of the first concave portion 22 and the second concave portion 24.

Figure 3A:
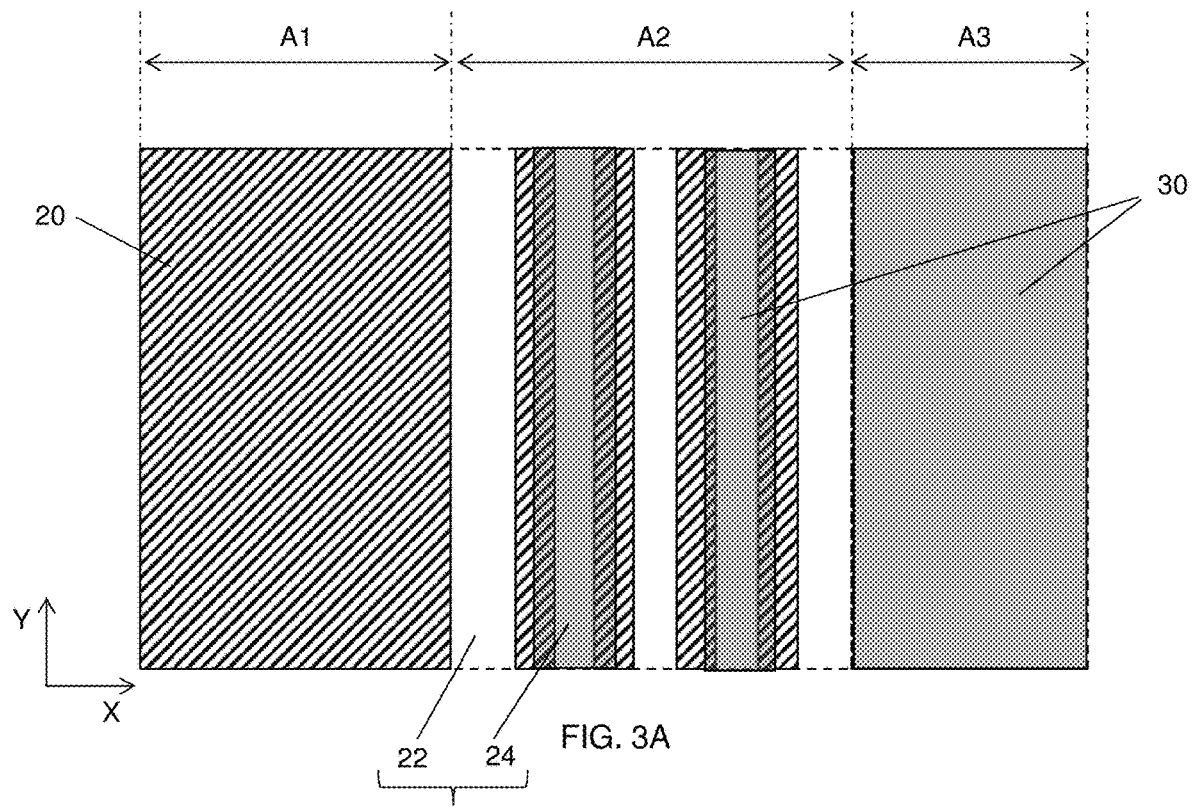
FIGS. 3A and 3B show plan views of the various stages of a sequential semiconductor device manufacturing process according to embodiments of the present disclosure.

FIG. 3A shows a plan view illustrating the patterns of the developed first photo resist layer 30 according to another embodiment of the present disclosure. In this embodiment, the second concave portion 24 is fully filled with the first photo resist layer and the first concave portion 22 is not filled with the first photo resist layer.

Figure 3B:
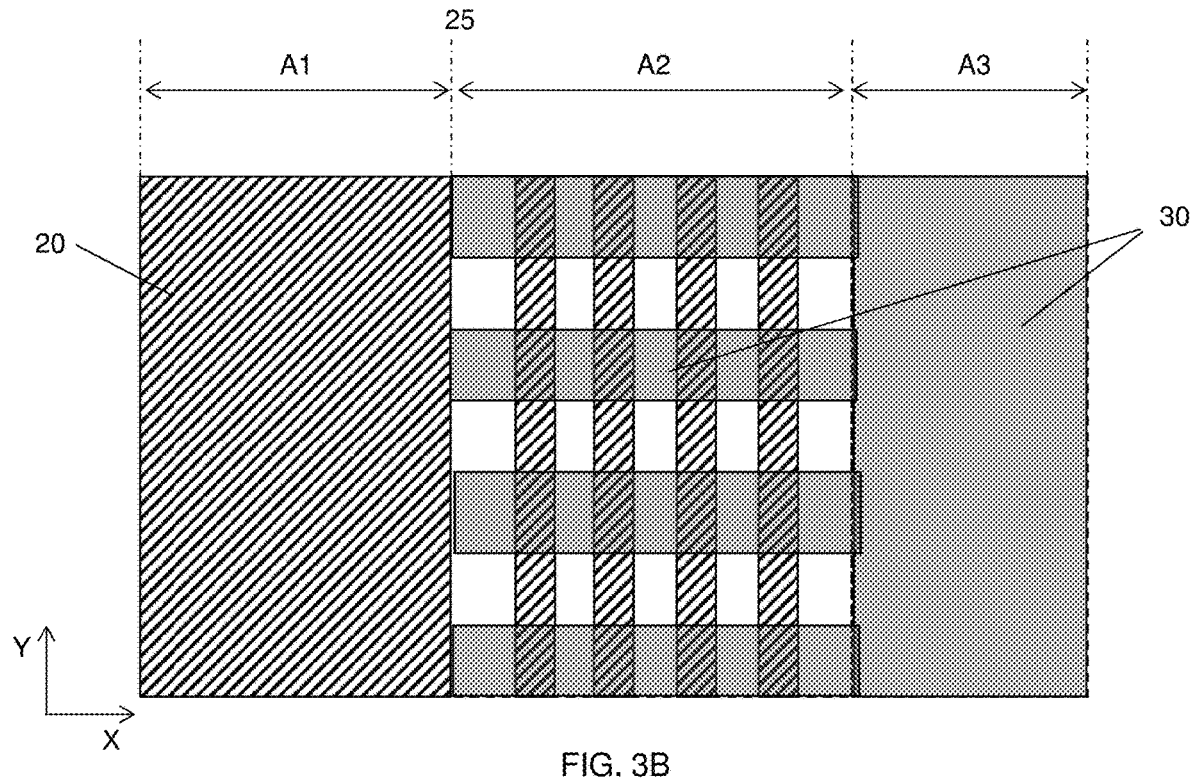

In FIGS. 2B and 3A, the developed first photo resist pattern 30 includes line and space patterns having the same direction as the concave patterns of the underlying structures 20. In FIG. 3B, the developed first photo resist pattern 30 includes line and space patterns having a different direction (the X direction) as the concave patterns of the underlying structures 20. In this case, a volume of the developed first photo resist layer 30 in the second area A2 is substantially equal to the volume of the concave portions in the second area A2.

Figure 4A:
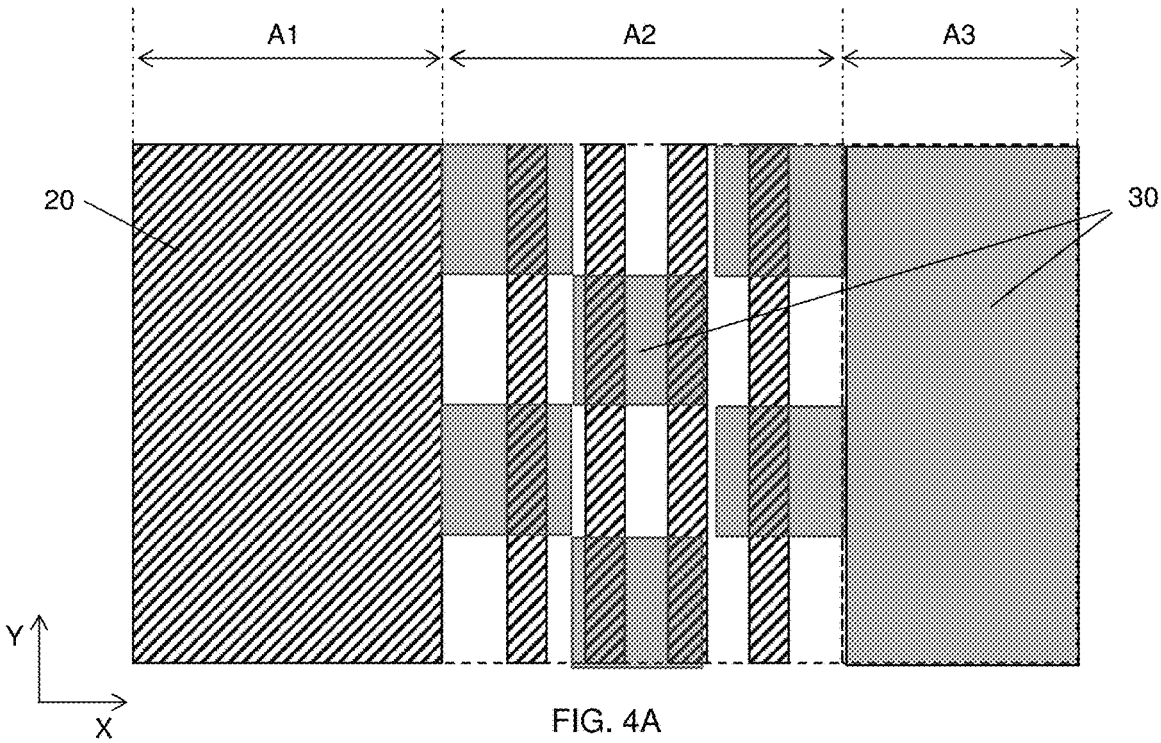
FIGS. 4A and 4B show plan views of the various stages of a sequential semiconductor device manufacturing process according to embodiments of the present disclosure.

FIG. 4A shows a plan view illustrating the patterns of the developed first photo resist layer 30 according to embodiments of the present disclosure. In FIG. 4, the developed first photo resist layer 30 includes a checker board pattern. In this case, a volume of the developed first photo resist layer 30 in the second area A2 is substantially equal to the volume of the concave portions in the second area A2.

Figure 4B:
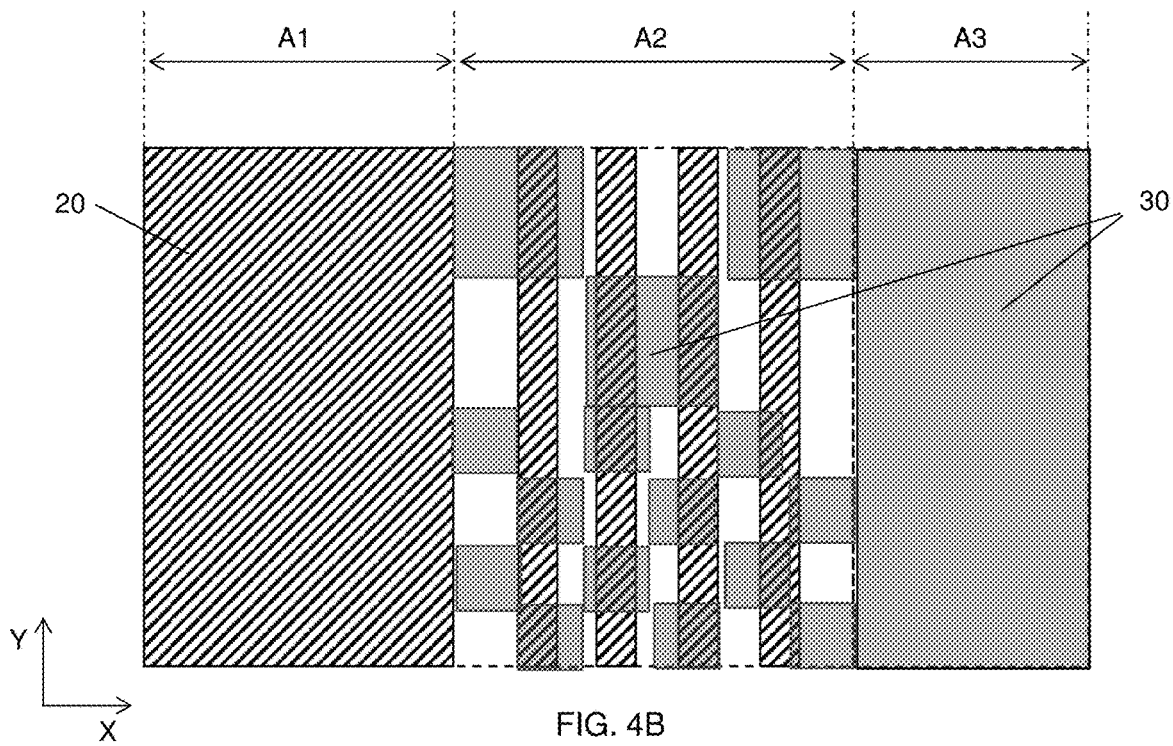

FIG. 4B shows a plan view illustrating the patterns of the developed first photo resist layer 30 according to embodiments of the present disclosure. In FIG. 4B, the developed first photo resist layer 30 includes checker board patterns with different dimensions. In this case, a volume of the developed first photo resist layer 30 in the second area A2 is substantially equal to the volume of the concave portions in the second area A2.

Figure 5A:
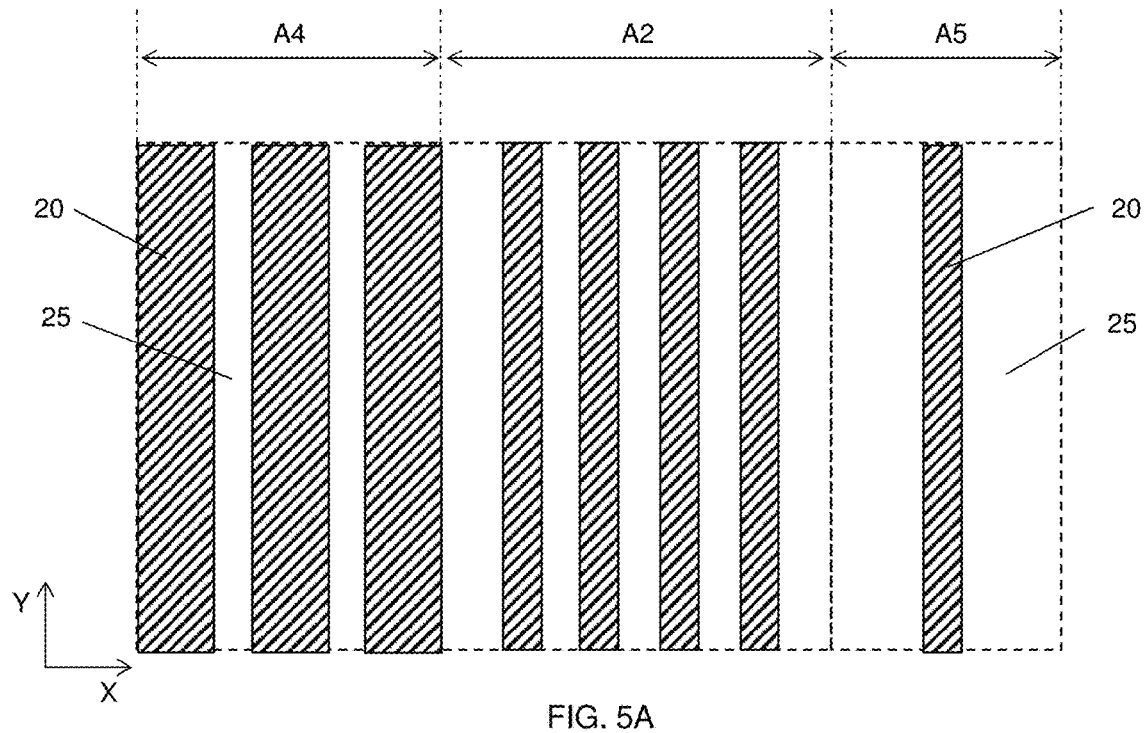
FIGS. 5A and 5B show plan views of the various stages of a sequential semiconductor device manufacturing process according to embodiments of the present disclosure.
Figure 5B:
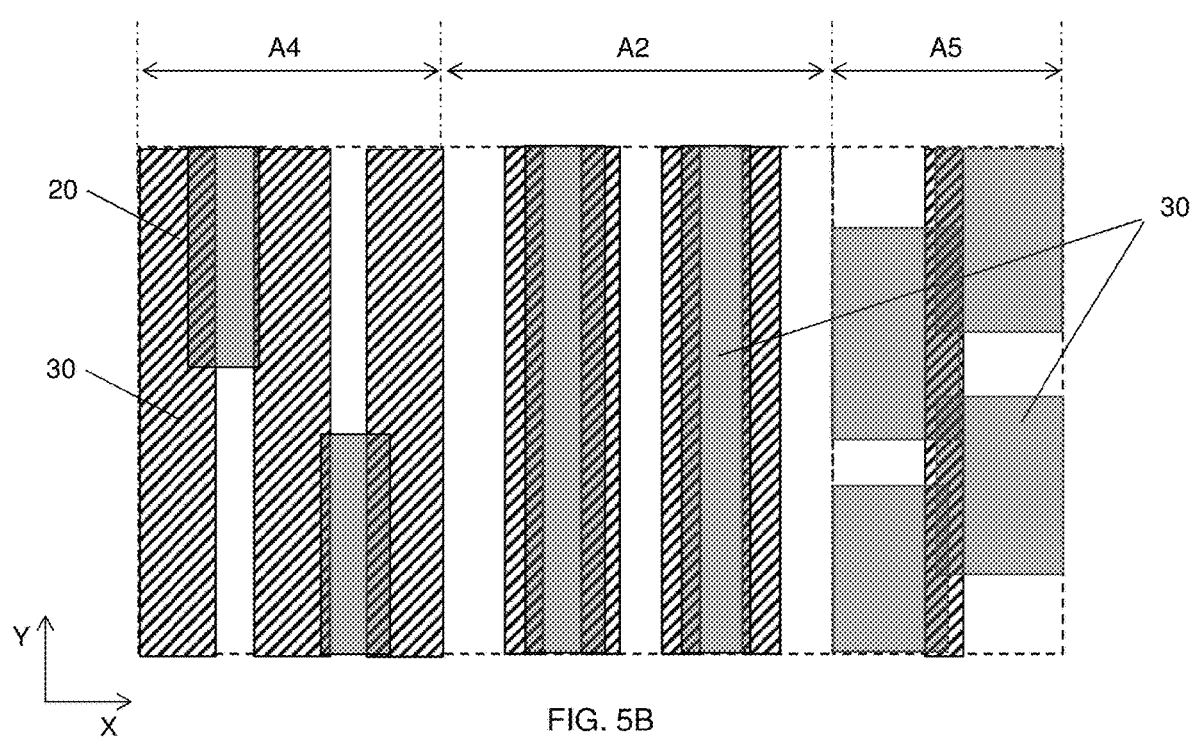

FIGS. 5A and 5B show plan views illustrating the patterns of the underlying structure 10 and the developed first photo resist layer 30 according to embodiments of the present disclosure.

In FIG. 5A, instead of the area A1, where no concave portion is provided, an area A4 is illustrated, and instead of the area A3, where no convex portion is provided (all concave), an area A5 is illustrated. The area A4 and area A3 include concave portions similar to the area A2. However, the pattern density PD4 of the area A4 is smaller than the pattern density PD2 of the area A2, and the pattern density PD5 of the area A5 is greater than the pattern density PD2 of the area A2.

As shown in FIG. 5B, the areas A2, A4 and A5 have different volumes of the developed resist patterns 30 according to their pattern density. In some embodiments, volumes of the developed resist patterns 30 ($V_4E$) in the area A4, the volumes of the developed resist patterns 30 ($V_2E$) in the area A2 and the volumes of the developed resist patterns 30 ($V_5E$) in the area A5 satisfy $V_4E<V_2E<V_5E$, and in each area, the volume of the developed first photo resist layer 30 is substantially equal to the volume of the concave portions.

In any of the foregoing embodiments, the second planarization layer 40 can be formed with a higher flatness (evenness), and thus it is possible to increase a focus margin in the subsequent lithography operations.

Figure 6A:
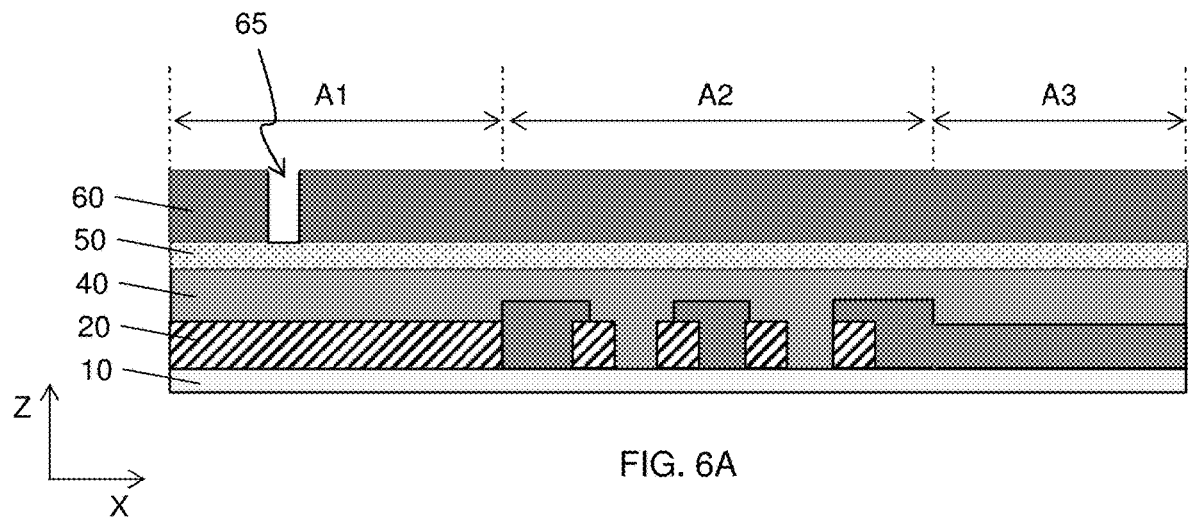
FIGS. 6A, 6B and 6C show cross sectional views of the various stages of a sequential semiconductor device manufacturing process according to embodiments of the present disclosure.
Figure 6B:
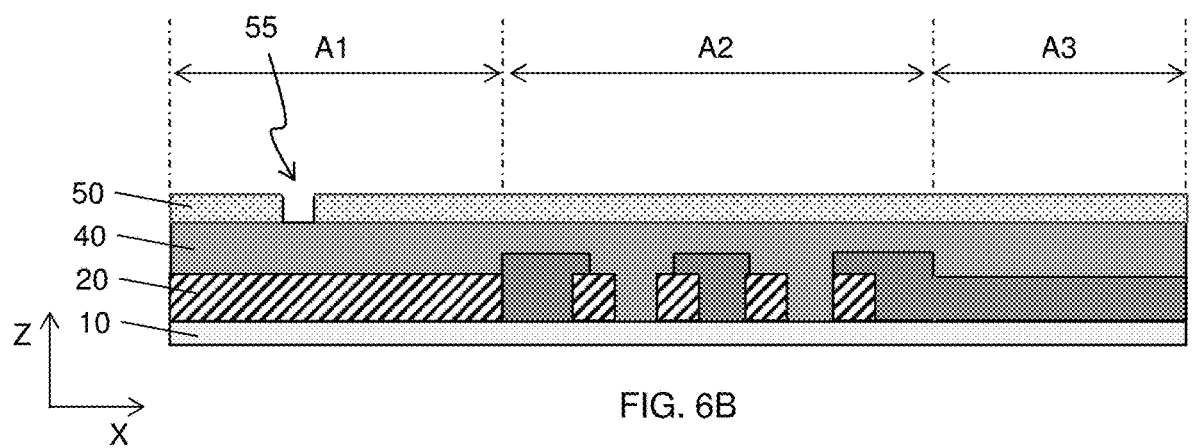
Figure 6C:
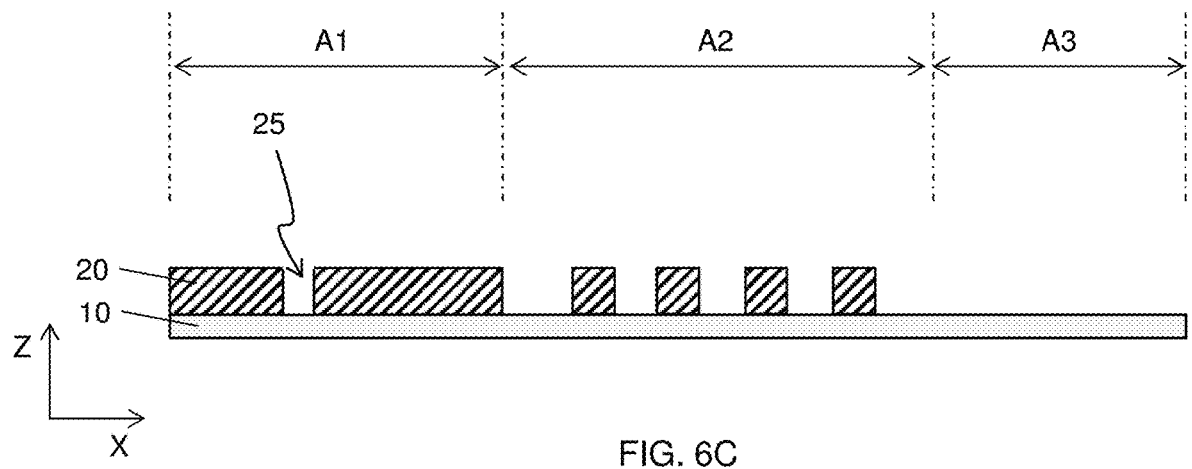

FIGS. 6A, 6B and 6C show cross sectional views of the various stages of a sequential semiconductor device manufacturing process according to embodiments of the present disclosure. It is understood that additional operations can be provided before, during, and after processes shown by FIGS. 6A-6C, and some of the operations described below can be replaced or eliminated, for additional embodiments of the method. The order of the operations/processes may be interchangeable.

After the second planarization layer 40 is formed as shown in FIG. 1E, a third planarization layer 50 is formed over the second planarization layer 40 as shown in FIG. 6A.

The third planarization layer 50 functions as a hard mask in the subsequent photo-etching operations. In some embodiments, the third planarization layer 50 includes one or more layers of silicon based material, such as amorphous silicon, silicon oxide, silicon nitride, silicon oxynitride and/or spin-on-glass (SOG), or any other suitable material. The third planarization layer 50 can be formed by chemical vapor deposition (CVD), physical vapor deposition (PVD), atomic layer deposition ALD), spin coating or any other suitable film forming method.

Further, after the third planarization layer 50 is formed, a second photo resist layer 60 is Ruined on the third planarization layer 50, as shown in FIG. 6A. The second photo resist layer 60 is subjected to exposure by an energy beam, such as KrF excimer laser light (245 nm), ArF excimer laser light (193 nm), extreme ultra violet (EUV) light (13.5 nm) or an electron beam. After the exposed second photo resist layer is developed, a pattern 65, such as a contact hole pattern, is formed in the second photo resist layer 60, as shown in FIG. 6A. Although only one contact hole pattern 65 is shown in FIG. 6A, the number of contact holes is not limited to one.

Subsequently, an etching operation is performed to etch the third planarization layer 50 (a hard mask layer) using the patterned second photo resist layer 50 as an etching mask, and then the second photo resist layer 60 is removed, as shown in FIG. 6B.

Subsequently, by using the patterned hard mask layer 50 as an etching mask, the second planarization layer 40 and the underlying structure 20 is patterned. After the patterning of a contact hole 25, the hard mask layer 50 (third planarization layer), the second planarization layer 40 and the first photo resist layer 30 are removed, as shown in FIG. 6C.

In some embodiments of the present disclosure, the underlying structures are formed by using one or more lithography operations and etching operations. Among the one or more lithography operations, one lithography operation which most affects the formation of the concave patterns is identified and a photo mask used in the identified lithography operation is designated as a first photo mask. It is possible to choose two or more photo masks as the first photo mask. Further, the photo mask used to form the first resist pattern 30 is designated as a second photo mask. An opaque area ratio of the second photo mask in an area of interest on the substrate is designed according to an opaque area ratio of the first photo mask in the area of interest.

For example, in the case where positive type photo resists are used as the first photo resist layer 30 and during the manufacturing operations of the underlying structures 20, an opaque area of the second photo mask in an area of interest on the substrate increases as an opaque area of the first photo mask in the area of interest decreases.

In some embodiments, the second photo mask can be designed by inverting a tone of the first photo mask, and adjusting line and/or space widths or shifting the patterns of the inverted mask pattern. The adjustment of the line and/or space widths or shifting the patterns can be performed before inverting the mask pattern. In some embodiments, the adjustment is performed such that the second photo mask pattern does not have a pattern having a threshold dimension or less, where the threshold dimension is set greater than the minimum pattern size of the first photo mask. In other words, the design rule (minimum dimension) of the second photo mask is greater than the design rule of the first photo mask.

In other embodiments, the second photo mask can be designed by measuring topography of the underlying patterns 20. The topography of the underlying patterns 20 can be measured by any optical measurement method and/or an atomic force microscopy. Based on the sizes and locations of the measured topography of the underlying patterns 20, the second photo mask pattern can be designed.

It is understood that the structure shown in FIG. 6C undergoes further CMOS processes to form various features such as interconnect vias, interconnect metal layers, passivation layers, etc.

Figure 7B:
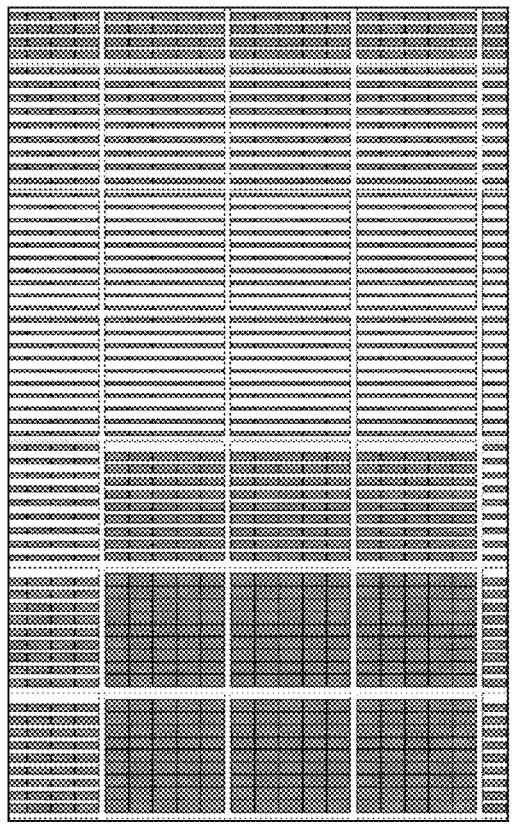
FIG. 7A shows a pattern density map and FIG. 7B shows a dummy pattern map according to embodiments of the present disclosure.
Figure 7A:
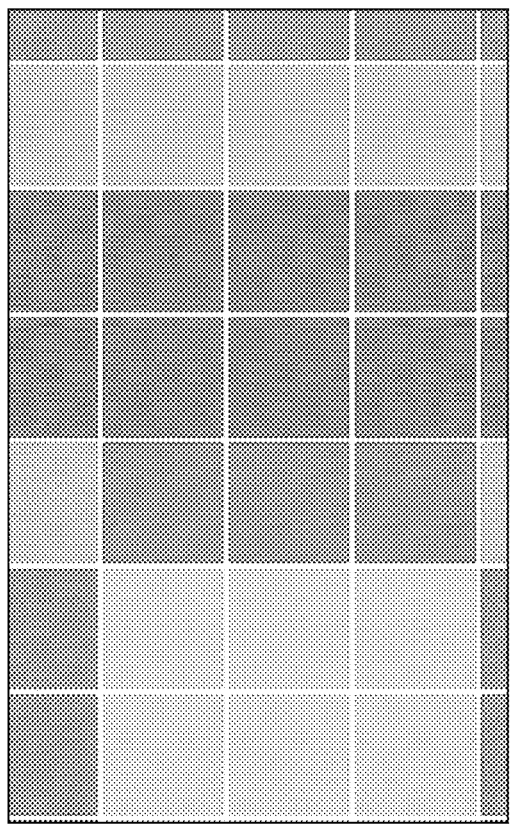

FIG. 7A shows a pattern density map and FIG. 7B shows a dummy pattern map according to embodiments of the present disclosure. As shown in FIG. 7A, a chip area is divided into matrix having a plurality of areas, and pattern density is calculated for each of the plurality of areas. Then, according to the calculated pattern density, dummy patterns with corresponding pattern density are provided for each of the plurality of areas. According to the provided dummy patterns a photo mask is formed.

In some embodiments, a photo mask pattern for the first photo resist layer 30 is obtained by using a mask pattern generating tool including a computer having a memory storing a program. According to the executed program, a pattern density PD of the underlying layer is calculated. The pattern density PD can be calculated from mask pattern data for the underlying layer. Then, areas on which first photo resist patterns are determined based on the calculated pattern density. Subsequently, the mask pattern data for the first photo resist layer 30 are generated, and a photo mask is fabricated using the generated mask pattern data.

The various embodiments or examples described herein offer several advantages over the existing art. In the present disclosure, the first planarization layer (first photo resist layer) is formed over the underlying uneven patterns (concave portions) such that the volume (e.g., $V_2E$) of the developed first photo resist layer is substantially equal to the volume (e.g., $V_2I$) of the concave portions, while a part of the concave portions is not filled with the developed first photo resist layer. With this configuration, it is possible to increase the flatness of the second planarization layer formed over the first planarization layer, and thus it is possible to increase a focus margin in the subsequent lithography operation.

According to one aspect of the disclosure, in a method of manufacturing a semiconductor device, a photo resist layer is formed over a substrate with underlying structures. The first photo resist layer is exposed to exposure radiation. The exposed first photo resist layer is developed with a developing solution. A planarization layer is formed over the developed photo resist layer. The underlying structures include concave portions, and a part of the concave portions is not filled by the developed first photo resist. In one or more of the foregoing or following embodiments, the planarization layer is made of an organic material. In one or more of the foregoing or following embodiments, the planarization layer is made of photo resist different from the photo resist layer. In one or more of the foregoing or following embodiments, the planarization layer has a different optical property than the photo resist layer. In one or more of the foregoing or following embodiments, the planarization layer is made of a material different from the photo resist layer in at least one selected from the group consisting of a polymer structure, an acid labile molecule, a photo acid generator (PAG) amount, a quencher amount, a chromophore, a cross linker, and a solvent. In one or more of the foregoing or following embodiments, the planarization layer is made of a same material as the photo resist layer. In one or more of the foregoing or following embodiments, the planarization layer is made of a bottom anti-reflective coating material. In one or more of the foregoing or following embodiments, the substrate includes a first area and a second area, a ratio of the concave portions of the first area is different from a ratio of the concave portions of the second area, and a ratio of the concave portions filled by the developed photo resist layer in the first area with respect to all the concave portions in the first area is different from a ratio of the concave portions filled by the developed photo resist layer in the second area with respect to all the concave portions in the second area. In one or more of the foregoing or following embodiments, the ratio of the concave portions of the first area is smaller than the ratio of the concave portions of the second area, and the ratio of the concave portions filled by the developed photo resist layer in the first area with respect to all the concave portions in the first area is smaller than the ratio of the concave portions filled by the developed photo resist layer in the second area with respect to all the concave portions in the second area. In one or more of the foregoing or following embodiments, the photo resist fills all the concave portions before the exposure.

According to another aspect of the present disclosure, in a method of manufacturing a semiconductor device, a photo resist layer is formed over a substrate having a target area with underlying structures. The first photo resist layer is exposed to exposure radiation. The exposed first photo resist layer is developed with a developing solution. A planarization layer is formed over the developed photo resist layer. The underlying structures include concave portions, and a top of the developed first photo resist layer is located at higher level than a top of the underlying structure. A volume Ve of the developed photo resist layer in the target area is in a range of 0.9 Vi<Ve<1.1 Vi, where Vi is a volume of the concave portions in the target area before the photo resist layer is formed. In one or more of the foregoing or following embodiments, 0.95 Vi<Ve<1.05 Vi. In one or more of the foregoing or following embodiments, the developed photo resist layer includes line and space patterns. In one or more of the foregoing or following embodiments, the developed photo resist layer includes a checker board pattern. In one or more of the foregoing or following embodiments, the concave patterns extend in a first direction, and the developed photo resist layer includes patterns extending in the first direction. In one or more of the foregoing or following embodiments, the concave patterns extend in a first direction, and the developed photo resist layer includes patterns extending in a second direction crossing the first direction. In one or more of the foregoing or following embodiments, the substrate includes a high-flat area having no concave portion, and no developed photo resist layers exist in the high-flat area. In one or more of the foregoing or following embodiments, the substrate includes a low-flat area having no protruding patterns and having a level equal to a bottom of the concave portions, and all of the low area is filled by the developed photo resist layer. In one or more of the foregoing or following embodiments, the planarization layer is made of a material including carbon and has a different optical property than the photo resist layer.

In accordance with another aspect of the present disclosure, in a method of manufacturing a semiconductor device, underlying structures are formed by a first patterning operation including a lithography operation using a first photo mask and an etching operation. A photo resist layer is formed over the underlying structures. Planarization patterns are formed by a second patterning operation including a lithography operation using a second photo mask on the photo resist layer. A second planarization layer is formed over the first planarization patterns. The second planarization layer is made of an organic material, and an opaque area ratio of the second photo mask in an area of interest on the substrate varies with respect to an opaque area ratio of the first photo mask in the area of interest.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a photo resist layer over a substrate with underlying structures;
   exposing the photo resist layer to exposure radiation;
   developing the exposed photo resist layer with a developing solution; and
   forming a planarization layer over the developed photo resist layer, wherein:
   the underlying structures include concave portions, and
   one of the concave portions is filled by the developed photo resist layer and one of the concave portions does not include the developed photo resist layer.

2. The method of claim 1, wherein the planarization layer is made of an organic material.

3. The method of claim 1, wherein the planarization layer is made of a photo resist material different from a material of the photo resist layer.

4. The method of claim 1, wherein the planarization layer has a different optical property than the photo resist layer.

5. The method of claim 1, wherein the planarization layer is made of a material different from a material of the photo resist layer in at least one material selected from the group consisting of a polymer structure, an acid labile molecule, a photo acid generator (PAG) amount, a quencher amount, a chromophore, a cross linker, and a solvent.

6. The method of claim 1, wherein the planarization layer is made of a same material as a material of the photo resist layer.

7. The method of claim 1, wherein the planarization layer is made of a bottom anti-reflective coating material.

8. The method of claim 1, wherein:
   the substrate includes a first area and a second area,
   a ratio of the concave portions of the first area is different from a ratio of the concave portions of the second area, and
   a ratio of the concave portions filled by the developed photo resist layer in the first area with respect to all the concave portions in the first area is different from a ratio of the concave portions filled by the developed photo resist layer in the second area with respect to all the concave portions in the second area.

9. The method of claim 8, wherein:
   the ratio of the concave portions of the first area is smaller than the ratio of the concave portions of the second area, and
   the ratio of the concave portions filled by the developed photo resist layer in the first area with respect to all the concave portions in the first area is smaller than the ratio of the concave portions filled by the developed photo resist layer in the second area with respect to all the concave portions in the second area.

10. The method of claim 1, wherein a photo resist material of the photo resist layer fills all the concave portions before the exposure.

11. A method of manufacturing a semiconductor device, the method comprising:
    forming a photo resist layer over a substrate having a target area with underlying structures;
    exposing the photo resist layer to exposure radiation;
    developing the exposed photo resist layer with a developing solution; and
    forming a planarization layer over the developed photo resist layer, wherein:
    the underlying structures include concave portions,
    the developed photo resist layer in one concave portion is in direct contact with one end of the concave portion and a top of the developed photo resist layer in the one concave portion is located at a higher level than a top of the underlying structures and partially extends over the one end to a neighboring concave portion, and
    a volume Ve of the developed photo resist layer in the target area is in a range of $0.9\ Vi < Ve < 1.1\ Vi$, where Vi is a volume of the concave portions in the target area before the photo resist layer is formed.

12. The method of claim 11, wherein $0.95\ Vi < Ve < 1.05\ Vi$.

13. The method of claim 11, wherein the developed photo resist layer includes line and space patterns.

14. The method of claim 11, wherein the developed photo resist layer includes a checker board pattern.

15. The method of claim 11, wherein:
    the concave portions extend in a first direction, and
    the developed photo resist layer includes patterns extending in the first direction.

16. The method of claim 11, wherein:
    the concave portions extend in a first direction, and
    the developed photo resist layer includes patterns extending in a second direction crossing the first direction.

17. The method of claim 11, wherein:
    the substrate includes a high-flat area having no concave portion, and
    no developed photo resist layer exists in the high-flat area.

18. The method of claim 11, wherein:
    the substrate includes a low-flat area having no protruding patterns and having a level equal to a bottom of the concave portions, and
    all of the low-flat area is filled by the developed photo resist layer.

19. The method of claim 11, wherein the planarization layer is made of a material including carbon and has a different optical property than the photo resist layer.

20. A method of manufacturing a semiconductor device, the method comprising:
    forming underlying structures by a first patterning operation including a lithography operation using a photo mask and an etching operation;

forming a photo resist layer over the underlying structures;

forming first planarization patterns by a second patterning operation including a lithography operation using a second photo mask on the photo resist layer over the underlying structures; and forming a second planarization layer over the first planarization patterns, wherein:

the second planarization layer is made of an organic material, and an opaque area ratio of the second photo mask in an area of interest over a substrate varies with respect to an opaque area ratio of the photo mask in the area of interest.

* * * * *